(12) United States Patent
Kim et al.

(10) Patent No.: US 9,371,583 B2
(45) Date of Patent: Jun. 21, 2016

(54) PLASMA PROCESSING MEMBER, DEPOSITION APPARATUS INCLUDING THE SAME, AND DEPOSITING METHOD USING THE SAME

(75) Inventors: Ki Jong Kim, Daejeon-si (KR); Hyun Kyu Cho, Daejeon-si (KR); Jin Su Lee, Daejeon-si (KR); Se Yong Kim, Daejeon-si (KR)

(73) Assignee: ASM GENITECH KOREA LTD., Cheonan-Si (KR)

( * ) Notice: Subject to any disclaimer, the term of this patent is extended or adjusted under 35 U.S.C. 154(b) by 1233 days.

(21) Appl. No.: 12/577,885

(22) Filed: Oct. 13, 2009

(65) Prior Publication Data

US 2010/0089320 A1    Apr. 15, 2010

(30) Foreign Application Priority Data

Oct. 13, 2008    (KR) .................. 10-2008-0100300

(51) Int. Cl.
| | |
|---|---|
| C23C 16/00 | (2006.01) |
| C23C 16/455 | (2006.01) |
| C23C 16/509 | (2006.01) |
| H01J 37/32 | (2006.01) |

(52) U.S. Cl.
CPC ..... *C23C 16/45551* (2013.01); *C23C 16/45542* (2013.01); *C23C 16/5096* (2013.01); *H01J 37/32009* (2013.01); *H01J 37/32091* (2013.01); *H01J 37/32146* (2013.01); *H01J 37/32568* (2013.01); *H01J 37/32733* (2013.01)

(58) Field of Classification Search
CPC .............. H01J 37/32174; H01J 37/32899
USPC .......... 156/345.43–345.45, 345.47; 118/719, 118/723 E, 723, 723 I
See application file for complete search history.

(56) References Cited

U.S. PATENT DOCUMENTS

| | | | | |
|---|---|---|---|---|
| 4,664,767 | A | * | 5/1987 | Kudo et al. .................. 204/164 |
| 5,404,017 | A | * | 4/1995 | Inuishi et al. ............... 250/492.3 |
| 6,021,991 | A | * | 2/2000 | Mayama et al. .............. 248/550 |
| 6,042,686 | A | * | 3/2000 | Dible et al. ............. 156/345.44 |
| 6,222,321 | B1 | * | 4/2001 | Scholl et al. .............. 118/723 E |
| 6,632,322 | B1 | * | 10/2003 | Gottscho et al. ......... 156/345.33 |
| 6,913,652 | B2 | * | 7/2005 | Shan ............................. 118/719 |
| 7,164,236 | B2 | * | 1/2007 | Mitrovic et al. ......... 315/111.01 |
| 7,540,257 | B2 | * | 6/2009 | Kishimoto et al. ....... 118/723 E |
| 8,282,983 | B1 | * | 10/2012 | Kapoor et al. ................ 118/719 |
| 2003/0079983 | A1 | * | 5/2003 | Long et al. .................... 204/164 |
| 2008/0246493 | A1 | * | 10/2008 | Gardner ........................ 324/662 |
| 2009/0124087 | A1 | * | 5/2009 | Nodera et al. ................ 438/710 |

\* cited by examiner

*Primary Examiner* — Gordon R Baldwin
*Assistant Examiner* — Charlee Bennett
(74) *Attorney, Agent, or Firm* — Lex IP Meister, PLLC

(57) ABSTRACT

A deposition apparatus according to an exemplary embodiment of the present invention includes a plurality of reaction spaces, a plurality of plasma electrodes respectively disposed in the reaction spaces, a first plasma processor connected to at least two plasma electrodes, and a first plasma power source connected to the first plasma processor. The first plasma processor may include a plasma distributor or a plasma splitter.

6 Claims, 17 Drawing Sheets

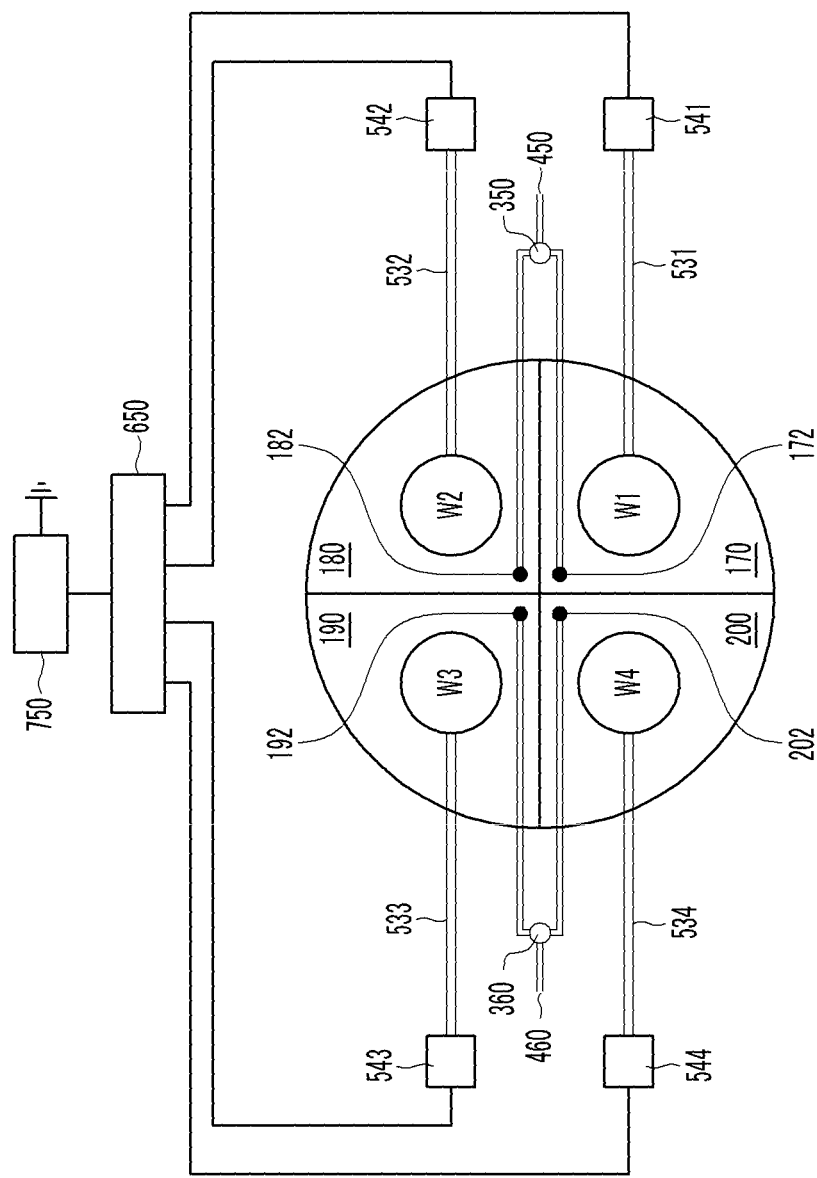

PLASMA PROCESSING MEMBER, DEPOSITION APPARATUS INCLUDING THE SAME, AND DEPOSITING METHOD USING THE SAME

CROSS-REFERENCE TO RELATED APPLICATION

This application claims priority to and the benefit of Korean Patent Application No. 10-2008-0100300 filed in the Korean Intellectual Property Office on Oct. 13, 2009, the entire contents of which are incorporated herein by reference.

BACKGROUND OF THE INVENTION (a) Field of the Invention

The present invention relates to a plasma processor, a deposition apparatus including the same, and a deposition method.

(b) Description of the Related Art

A process technology with which a conductive or non-conductive thin film is uniformly and correctly deposited has become important as semiconductor integration technology has been developed.

Thin film deposition methods may be classified into chemical vapor deposition (CVD), physical vapor deposition (PVD), and atomic layer deposition (ALD), and these deposition methods use plasma.

Meanwhile, to increase thin film deposition speed, the requirement for a multi-wafer processing system simultaneously processing several substrates is increased. In this multi-wafer atomic layer deposition system, when using a spatial division, it is important to generate uniform plasma by using a simple device in each reaction space in a plasma enhancement deposition method.

To generate the uniform plasma, plasma power supplied to each reaction space must be uniform. To generate the uniform plasma in each reaction space, each reaction space may be connected to a different plasma power source and may be applied with the same plasma power, however the equipment is complicated and the cost is increased in this case.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a plasma processor and a deposition apparatus including the same, and a deposition method for easily providing uniform plasma to each reaction space in a deposition apparatus using a multi-wafer processing system.

A deposition apparatus according to an exemplary embodiment of the present invention includes a plurality of reaction spaces, a plurality of plasma electrodes respectively disposed in the reaction spaces, a first plasma processor connected to at least two plasma electrodes, and a first plasma power source connected to the first plasma processor.

The first plasma processor may include a plasma distributor. The plasma distributor may include a plurality of distributing circuits. The output terminals of the distributing circuits may be respectively connected to the plasma electrodes. The first plasma processor may further include a sensor connected between the output terminals of the distributing circuits and the plasma electrodes. The first plasma processor may further include a plasma distributor driving circuit connected to the sensor and controlling the operation of the plasma distributor. The first plasma processor may include a plasma splitter. The plasma splitter may include a plurality of switches for switching to connect the input terminals connected to the first plasma power source to the output terminals. The output terminals of the switches may be respectively connected to the plasma electrodes. The first plasma processor may further include a plasma splitter driving circuit controlling the operation of the switches. The first plasma processor may include a plasma splitter and a plasma distributor connected to the plasma splitter. The plasma splitter may include a plurality of switches for switching to connect the input terminals connected to the first plasma power source to the output terminals, and the output terminals of the switches may be respectively connected to the plasma distributor. The plasma distributor may include a plurality of plasma distributing circuits, and the output terminals of the plasma distributing circuits may be respectively connected to the plasma electrodes. The first plasma processor may further include a driving circuit controlling the operation of the plasma splitter. The deposition apparatus may further include a plurality of matching members connected between the first plasma processor and the plasma electrodes.

The deposition apparatus may further include a second plasma processor connected to at least two remaining plasma electrodes excluding the at least two among the plasma electrodes, and a second plasma power source connected to the second plasma processor.

The second plasma processor may include a plasma distributor. The plasma distributor may include a plurality of distributing circuits. The output terminals of the distributing circuits may be respectively connected to the plasma electrodes. The second plasma processor may further include a sensor connected between the output terminals of the distributing circuits and the plasma electrodes. The second plasma processor may further include a plasma distributor driving circuit connected to the sensor and controlling the operation of the plasma distributor. The second plasma processor may include a plasma splitter. The plasma distributor may include a plurality of distributing circuits. The output terminals of the distributing circuits may be respectively connected to the plasma electrodes. The second plasma processor may further include a sensor connected between the output terminals of the distributing circuits and the plasma electrodes. The second plasma processor may further include a plasma distributor driving circuit connected to the sensor and controlling the operation of the plasma distributor. The second plasma processor may include a plasma splitter. The plasma splitter may include a plurality of switches for switching to connect the input terminals connected to the second plasma power source to the output terminals. The output terminals of the switches may be respectively connected to the plasma electrodes. The second plasma processor may further include a driving circuit controlling the operation of the plasma splitter.

A plasma processor according to an exemplary embodiment of the present invention includes a plurality of plasma distributing circuits connected to one plasma power source, a plurality of plasma electrodes connected to the output terminals of the plasma distributing circuits, and a driving circuit controlling the plasma distributing circuits.

A plurality of sensors connected between the output terminals of the plasma distributing circuits and the plasma electrodes may further included, and the sensors are connected to the driving circuits.

A plasma processor according to another exemplary embodiment of the present invention includes an input terminal connected to one plasma power source, a switch connected to the input terminal and switching to connect the input terminal to a plurality of output terminals, a plurality of plasma electrodes respectively connected to the output terminals, and a driving circuit controlling the operation of the switch.

A plasma processor according to another exemplary embodiment of the present invention includes an input terminal connected to one plasma power source, a switch connected to the input terminal and switching to connect the input terminal to a plurality of output terminals, a plurality of plasma distributing circuits respectively connected to the output terminals, and a plurality of plasma electrodes respectively connected to the output terminals of the plasma distributing circuits.

The plasma processor may further include a plurality of sensors respectively connected between the output terminals of the plasma distributing circuits and the plasma electrodes, and a driving circuit connected to the sensors and controlling the plasma distributing circuits.

According to an exemplary embodiment of the present invention, in a deposition apparatus using a multi-wafer processing system, the plasma may be easily and simply generated in each reaction space through simple configurations.

BRIEF DESCRIPTION OF THE DRAWINGS

FIG. 4A and FIG. 4B are waveform diagrams illustrating an operation of a multi-wafer deposition apparatus according to an exemplary embodiment of the present invention.

FIG. 7A and FIG. 7B are waveform diagrams illustrating an operation of a multi-wafer deposition apparatus according to the second exemplary embodiment of the present invention.

FIG. 8 is a layout view of a multi-wafer deposition apparatus according to third exemplary embodiment of the present invention.

Figure 10:
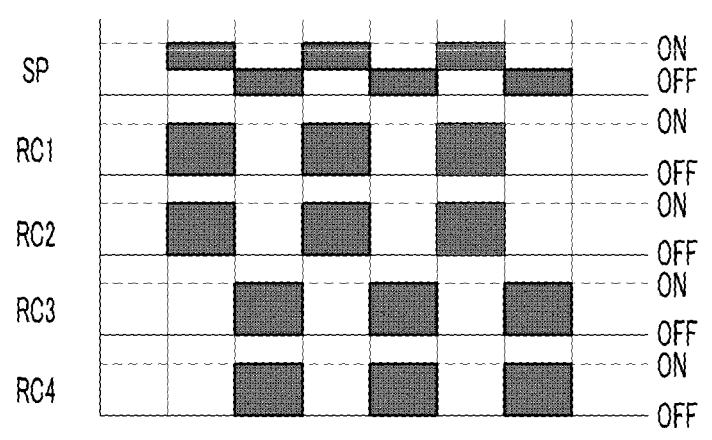

FIG. 10 is a waveform diagram illustrating an operation of a multi-wafer deposition apparatus according to third exemplary embodiment of the present invention.

Figure 13:
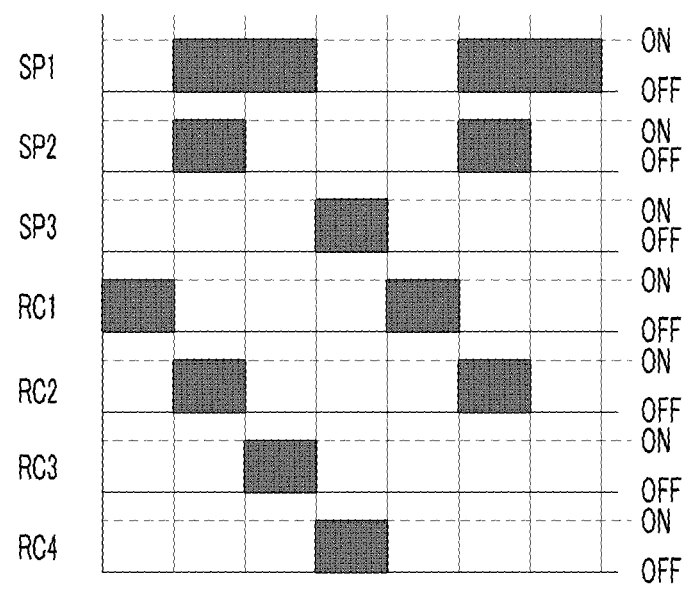

FIG. 13 is a waveform diagram illustrating an operation of a multi-wafer deposition apparatus according to forth exemplary embodiment of the present invention.

DETAILED DESCRIPTION OF THE EMBODIMENTS

Figure 1:
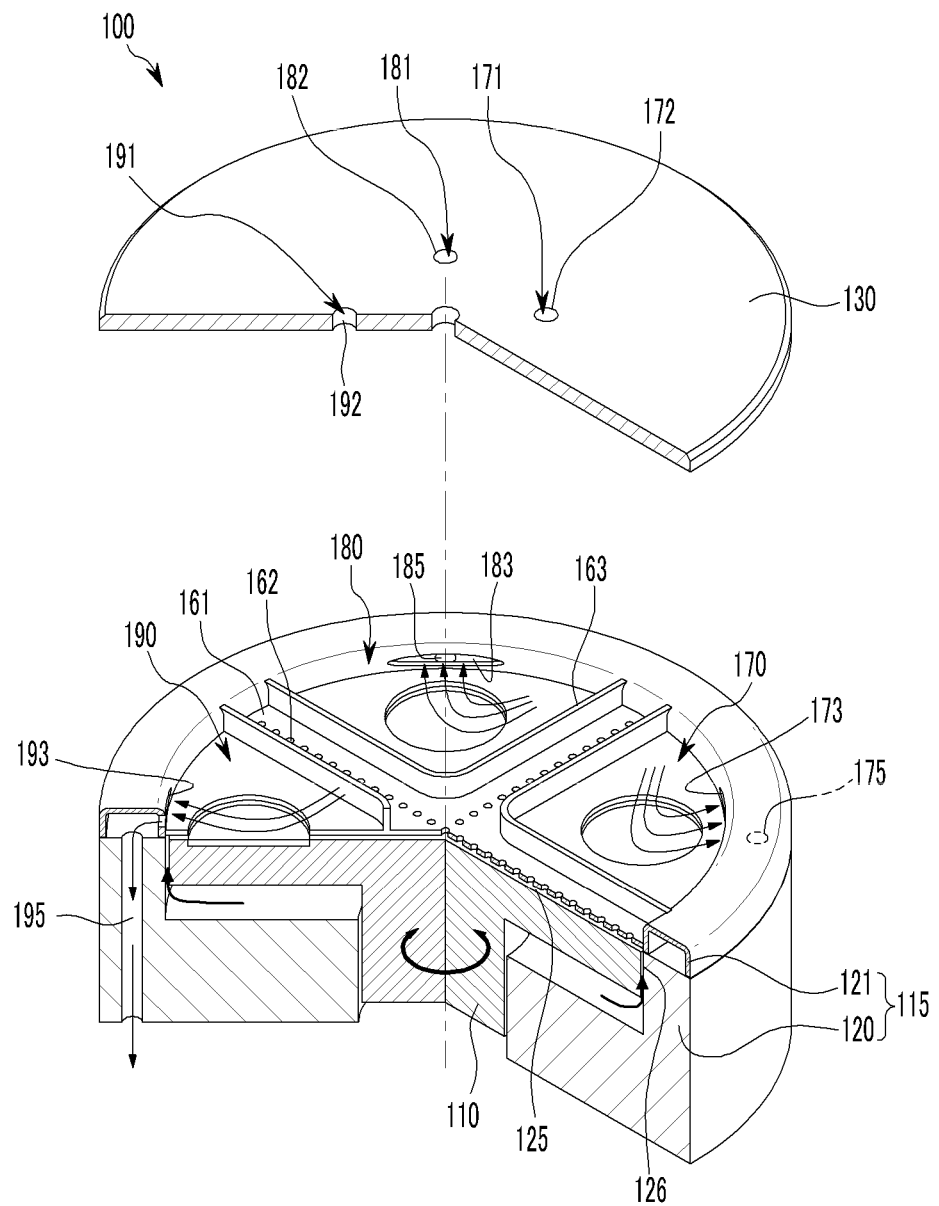
FIG. 1 is a schematic diagram of a multi-wafer deposition apparatus according to an exemplary embodiment of the present invention.

The advantages, characteristics, and means for achieving them of the present invention will become apparent from reference to the exemplary embodiments in the following detailed description accompanying the drawings. However, the present invention is not limited by the hereafter-disclosed exemplary embodiments, and may be modified in various different ways. The present exemplary embodiments provide complete disclosure of the present invention and complete information of the scope of the present invention to those skilled in the art, and the present invention is defined by the scope of the claims.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. When it is said that any part, such as a layer, film, area, or plate is positioned "on" another part, it means the part is directly on the other part or above the other part with at least one intermediate part. In contrast, when an element is referred to as being "directly on" another element, there are no intervening elements present.

Firstly, a multi-wafer deposition apparatus 100 according to an exemplary embodiment of the present invention will be described with reference to FIG. 1 and FIG. 2.

Figure 2:
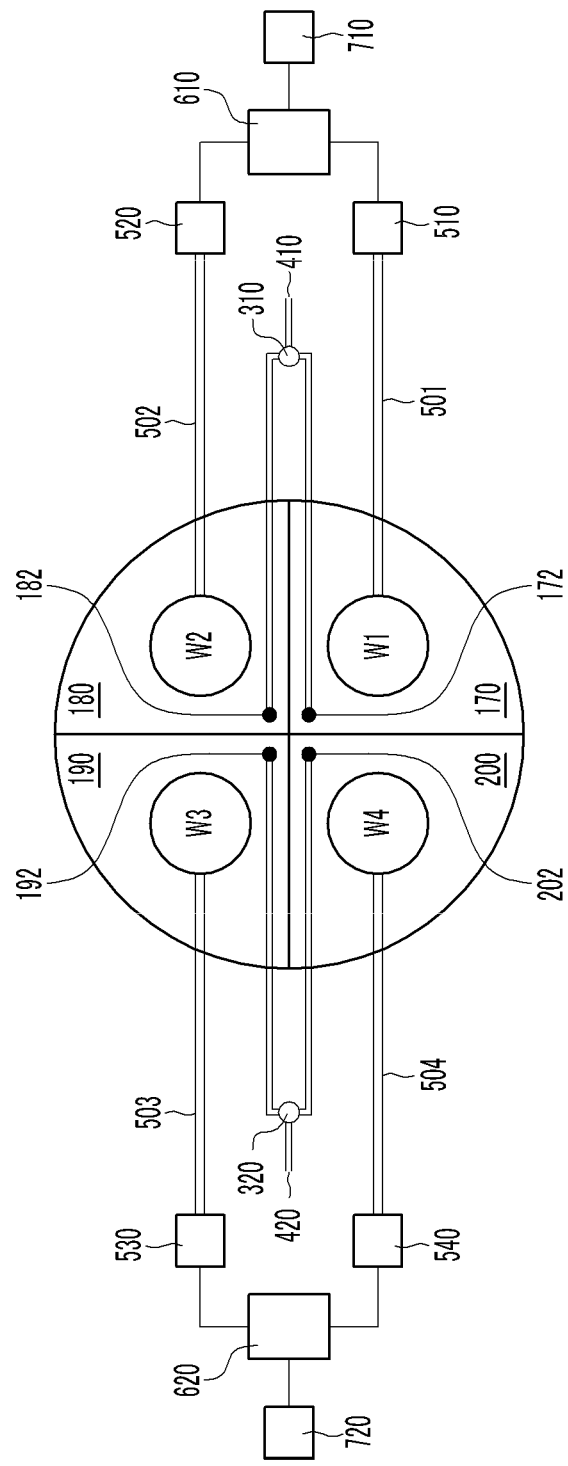
FIG. 2 is a layout view of the multi-wafer deposition apparatus shown in FIG. 1 according to an exemplary embodiment of the present invention.

FIG. 1 is a schematic diagram of a multi-wafer deposition apparatus according to an exemplary embodiment of the present invention, and FIG. 2 is a layout view of the multi-wafer deposition apparatus shown in FIG. 1 according to an exemplary embodiment of the present invention.

A deposition apparatus shown in FIG. 1 and FIG. 2 as a portion of a large system or a reactor is a portion of a loading system such as a load platform, a load-back chamber, and robots, or a portion of the reactor including a gas supply system and a control systems such as a memory, a processor, and a user interface, that are programmed to sequentially execute a method according to an exemplary embodiment of the present invention. Also, the position of the constituent elements is relative with reference to other portions, and is not absolute.

Referring to FIG. 1 and FIG. 2, the multi-wafer deposition apparatus 100 includes a lower portion 115 and an upper portion (or a cover) 130. The lower portion 115 includes a lower body 120 and an upper body 121. A deposition apparatus 100 according to the present exemplary embodiment includes first to fourth reaction spaces 170, 180, 190, and 200. A substrate supporting platform 110 transfers a substrate or wafers W1 to W4 between the reaction spaces. In the present exemplary embodiment, the reaction spaces 170, 180, 190, and 200 are partioned by a purge wall defined by a vertical plate 163, and a space between purge walls has a channel 161 receiving a purge gas from a pipe (not shown) of the cover and outputting the purge gas into a region 125 under the reaction space through a hole 162. The region 125 is defined by a substrate supporting platform 110, and the cover 130 or the upper body 121. The reaction spaces 170, 180, 190, and 200 are defined by a plurality of walls including the cover 130, the vertical plate 163, the substrate, and the substrate supporting platform 110.

Each lower portion of the reaction spaces may be defined by a horizontal wall having an empty space for mounting the surface of the substrate. In the present exemplary embodiment, the reaction space 170 is disposed adjacent to the reaction space 180, the reaction space 180 is disposed adjacent to the reaction space 190, the reaction space 190 is disposed adjacent to the reaction space 200, and the reaction space 200 is disposed adjacent to the reaction space 170. The cover 130 covers the upper portion of the openings of the reaction spaces 170, 180, 190, and 200, and the channel 161 for providing an airtight connection. The reaction spaces receives the gas from inlets 172, 182, 192, and 202 of the cover 130, and outputs the gas through outlets 173, 183, and 193 formed on the side wall of the reaction spaces, and vertical exhaust passages 175, 185, and 195. In FIG. 1, three outlets and vertical exhaust passages are shown among four reaction spaces. The reaction spaces include a gas dispersion member (not shown) for dispersing the gas inflowed from the inlets 172, 182, 192, and 202 at the whole surface of the substrate, and the gas dispersion member may be a shape known to a person of ordinary skill in the art such as a showerhead or trumpet shape.

Referring to FIG. 1, the lower portion 115 of the atomic layer deposition apparatus 100 includes the lower body 120 and the upper body 121. The upper body 121 is disposed to insert the cover 130, and the cover 130 is disposed on the vertical plate 163.

The gas is inflowed through the inlets 172, 182 and 192 of the cover 130. The gas is exhausted from the reaction spaces 170, 180, and 190 through the outlets 173, 183, and 193 formed on the side surface of the reaction space and then the gas is exhausted into the vertical exhaust passages 175, 185, and 195 disposed at the lower body 120. It is preferable that the outlets of the reaction spaces are respectively partioned. Accordingly, the mixture of the gas state of the reaction material that may generate unnecessary particles is prevented, and the mixture of the gas state is generated sufficiently away from the reaction space such that contamination of the reaction space can be reduced. The exhaust passage may be connected to a pumping system. When a common pumping system to reduce cost is used for preventing the generation of the particles at the inlet of the reaction space, the outlets are preferrabley connected each other at a portion far away from each reaction region. In FIG. 1, an arrow means a general gas flowing direction in the atomic layer deposition apparatus 100.

The wafers W1, W2, W3 and W4 have an upper surface at least partially exposed to the respective reaction spaces 170, 180, 190, and 200. Referring to FIG. 2, the upper surface of the wafer W1 is exposed to the reaction space 170, the upper surface of the wafer W2 is exposed to the reaction space 180, the upper surface of the wafer W3 is exposed to the reaction space 190, and the upper surface of the wafer W4 is exposed to the reaction space 200. In another exemplary embodiment, the substrate supporting platform 110 is disposed adjacent to the walls defining the reaction spaces such that the empty spaces of the reaction spaces may be effectively closed and sealed. When the reaction spaces are not substantially closed and sealed, and a space exists between the substrate supporting platform 120 and the upper body 121, the purge gas flows under the channel 161 to the region 125 under the reaction spaces 170, 180, 190, and 200 such that the reaction spaces are preferably isolated.

In the present exemplary embodiment, the substrate supporting platform 110 may include a rotation shaft (not shown). The substrate supporting platform 110 may be continuously or sequentially rotated. In another exemplary embodiment, the substrate supporting platform 110 may be rotated back-and-forth. The reaction materials inflow and meet each other at the space between the substrate supporting platform 110 and the lower body 120 such that the space is purged by the purge gas to prevent the contamination within the space. The purge gas continuously flows upward toward the reaction space through a space 126 between the lower body 120 and the substrate supporting platform 110. The purge gas is exhausted through the outlets 173, 183, and 193.

In another exemplary embodiment according to the present invention, the substrate supporting platform may be vertically moved with respect to the reaction space. This vertical movement separates the wafers from the reaction spaces, and exposes the empty space region under each reaction space.

Referring to FIG. 2, a multi-wafer deposition apparatus 100 according to an exemplary embodiment of the present invention includes first to fourth plasma electrodes 501, 502, 503, and 504 respectively inserted into the reaction spaces 170, 180, 190, and 200. The first to fourth plasma electrodes 501, 502, 503, and 504 are respectively applied with a voltage to generate plasma to the reaction spaces 170, 180, 190, and 200 of the deposition apparatus 100. The first to fourth plasma electrodes 501, 502, 503, and 504 are respectively connected with first to fourth matching members 510, 520, 530, and 540, and the first matching member 510 and the second matching member 520, and the third matching member 530 and the fourth matching member 540, are connected in pairs to a first plasma processor 610 and a second plasma processor 620, respectively. Also, the first plasma processor 610 and the second plasma processor 620 are respectively connected to a first power source 710 and a second power source 720.

In the multi-wafer deposition apparatus 100 according to an exemplary embodiment of the present invention, the first plasma processor 610 connected to the first power source 710 receives power from the first power source 710 and applies the power with a predetermined magnitude at a predetermined time to the first matching member 510 and the second matching member 520 such that the first plasma electrode 501 and the second plasma electrode 502 are applied with the predetermined voltage. Also, the second plasma processor 620 connected to the second power source 720 receives power from the second power source 720 and applies the power with a predetermined magnitude at a predetermined time to the third matching member 530 and the forth matching member 540 such that the third plasma electrode 503 and the forth plasma electrode 504 are applied with the predetermined voltage. Like this way, the multi-wafer deposition apparatus according to an exemplary embodiment of the present invention includes the plasma processors 610 and 620 such that the plasma electrodes disposed in the plurality of reaction spaces may be applied with the plasma voltage with the predetermined magnitude at the predetermined time without connection with a different power source.

Referring to FIG. 1 and FIG. 2, the gas may be directly inflowed into the reaction spaces 170, 180, and 190 through gas pipes 171, 181, and 191, respectively. Each gas pipes 171, 181, and 191 may be a cylindrical shaped tube, and may have an optional structure for transporting the gas. The gas pipes are preferably made of stainless steel.

The gas pipes 171, 181, and may be respectively disposed at the inlets 172, 182, 192, and 202. In the multi-wafer deposition apparatus 100 according to the present exemplary embodiment, the first inlet 172 and the second inlet 182, and the third inlet 192 and the fourth inlet 202, are respectively connected to one of outer pipes 410 and 420 at intersecting points, and the intersecting points may include switches 310 and 320. Through the switches 310 and 320, one of the first inlet 172 and the second inlet 182 may be connected to the outer pipes 410, and one of the third inlet 192 and the fourth inlet 202 may be connected to the outer pipes 420.

Figure 3:
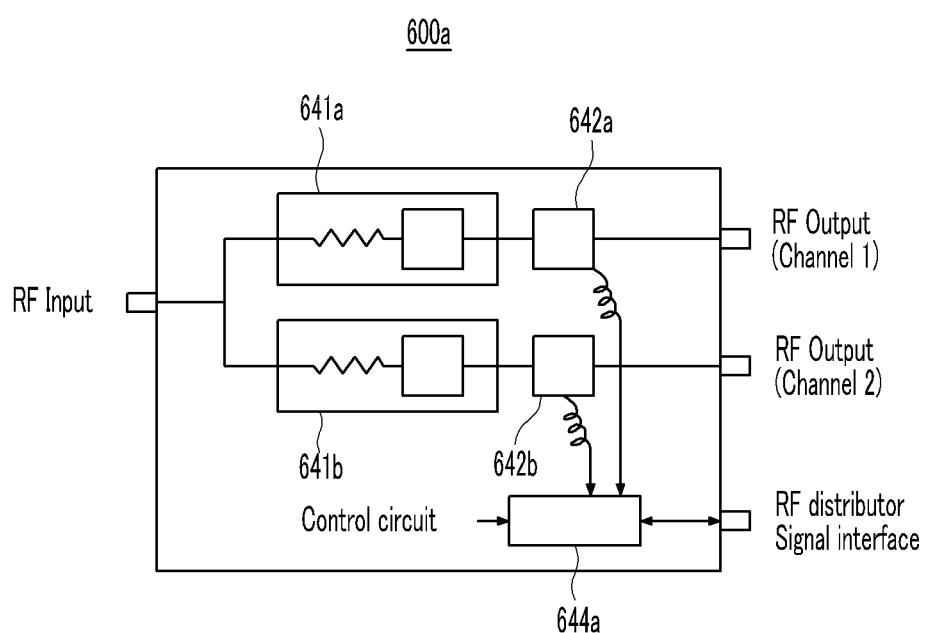
FIG. 3 is a schematic view of a plasma processor in a multi-wafer deposition apparatus according to an exemplary embodiment of the present invention.
Figures 4A, 4B:
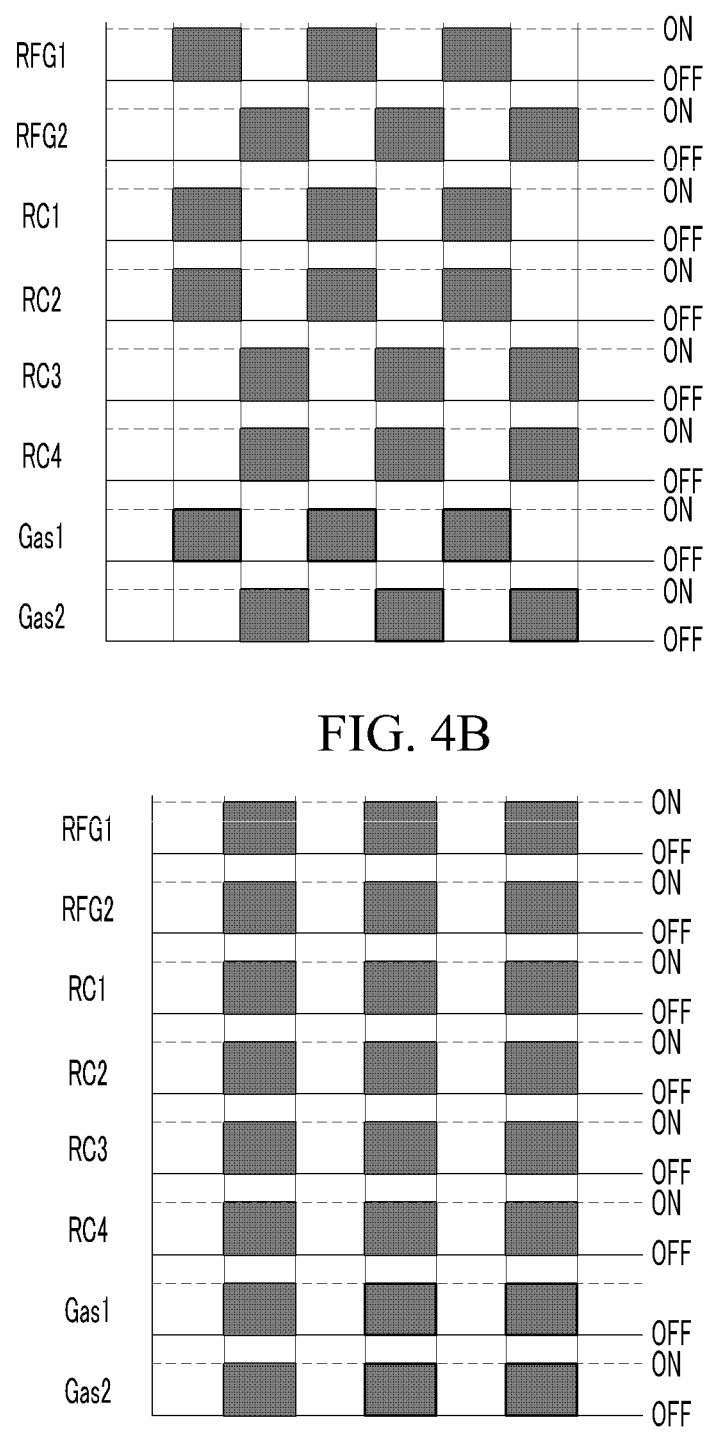

A plasma processor of a multi-wafer deposition apparatus and an operation thereof according to an exemplary embodiment of the present invention will be described with reference to FIG. 3 and FIG. 4A and FIG. 4B. FIG. 3 is a schematic view of a plasma processor in a multi-wafer deposition apparatus according to an exemplary embodiment of the present invention, and FIG. 4A and FIG. 4B are waveform diagrams illustrating an operation of a multi-wafer deposition apparatus according to another exemplary embodiment of the present invention.

The plasma processors 610 and 620 of a multi-wafer deposition apparatus according to the present exemplary embodiment include a plasma distributing unit 600a. Referring to FIG. 3, the plasma distributing unit 600a includes first and second distributors 641a and 641b, sensors 642a and 642b respectively connected to the distributors 641a and 641b, and a driving circuit 644a connected to the sensors 642a and 642b for controlling the distributors 641a and 641b.

The distributors 641a and 641b respectively include a power source distributing circuit for distributing input plasma power, for example radio frequency (RF) power, with the same magnitude such that input plasma power is distributed and outputted with the same magnitude. The sensors 642a and 642b connected to the distributors 641a and 641b measure the magnitude of the power outputted from the distributor 641a and 641b and determine whether the input plasma power is distributed with the predetermined magnitude. The driving circuit 644a that is connected to the sensors 642a and 642b controls the distributors 641a and 641b depending on the magnitude of the plasma power outputted from the distributors 641a and 641b and the external signal (a distributor signal interface) to distribute the input plasma power with the predetermined magnitude.

An operation of the multi-wafer deposition apparatus including the plasma distributing unit 600a shown in FIG. 3 will be described with reference to FIG. 4A and FIG. 4B.

The plasma distributing unit 600a according to the present exemplary embodiment may be one example of the first plasma processor 610 or the second plasma processor 620 of the multi-wafer deposition apparatus shown in FIG. 2, such that the first distributor 641a and the second distributor 641b may be respectively connected to the portion of the first to fourth plasma electrodes 501, 502, 503, and 504 connected to the plurality of reaction spaces. For example, the first distributor 641a may be connected to the first plasma electrode 501 disposed in the first reaction space 170 and the second distributor 641b may be connected to the second plasma electrode 502 disposed in the second reaction space 180, or the first distributor 641a may be connected to the third plasma electrode 503 disposed in the third reaction space 190 and the second distributor 641b may be connected to the fourth plasma electrode 504 disposed in the fourth reaction space 200. In FIG. 4A and FIG. 4B, on/off operation of the power input to the first plasma processor 610 and the second plasma processor 620 are respectively denoted by RFG1 and RFG2, on/off operation of the voltage applied to the first to fourth plasma electrodes 501, 502, 503, and 504 are respectively denoted by RC1, RC2, RC3, and RC4, and a period for supplying the reaction gas to the reaction spaces 170 and 180, in which the first and second plasma electrodes 501 and 502 are inserted, and a period for supplying the reaction gas to the reaction spaces 190 and 200, in which the third and fourth plasma electrodes 503 and 504 are inserted, are respectively denoted by Gas 1 and Gas 2.

Referring to FIG. 4A, as shown by RFG1 and RFG2, the first plasma processor 610 and the second plasma processor 620 including the first distributor 641a and the second distributor 641b may be alternately applied with the power; as shown by RC1 and RC2, the power applied by the first distributor 641a and the second distributor 641b is distributed during the time period in which the power is applied to the first plasma processor 610 such that the voltage is applied to the first plasma electrode 501 and the second plasma electrode 502 connected to the first plasma processor 610; and as shown by RC3 and RC4, the power applied during the time period in which the power is applied to the second plasma processor 620 is distributed by the first distributor 641a and the second distributor 641b such that the voltage is applied to the third plasma electrode 503 and the fourth plasma electrode 504.

Also, as shown by Gas 1 and Gas 2, when the voltage is applied to the first plasma electrode 501 and the second plasma electrode 502, the reaction gas is supplied to the gas inlets 172 and 182 of the first and second reaction spaces 170 and 180 inserted with the first plasma electrode 501 and the second plasma electrode 502 to generate the plasma to the first and second reaction spaces 170 and 180, and the reaction gas is not supplied to the third and the fourth reaction spaces 190 and 200. When the plasma generation process of the first and second reaction spaces 170 and 180 is finished, the voltage is applied to the third plasma electrode 503 and the fourth plasma electrode 504, and during the time that the voltage is applied to the third plasma electrode 503 and the fourth plasma electrode 504, the reaction gas is supplied to the gas inlets 192 and 202 of the third and fourth reaction spaces 190 and 200 to generate the plasma to the third and fourth reaction spaces 190 and 200 and the reaction gas is not supplied to the gas inlets 172 and 182 of the first and second reaction spaces 170 and 180. This process is periodically repeated.

Referring to FIG. 4B, as shown by RFG1 and RFG2, the power may be simultaneously applied to the first plasma processor 610 and the second plasma processor 620, and as shown by RC1 to RC4, during the time that the first plasma processor 610 and the second plasma processor 620 are applied with the power, the applied power is distributed by the first distributor 641a and the second distributor 641b such that the voltage is applied to the first to fourth plasma electrodes 501, 502, 503, and 504.

Also, as shown by Gas 1 and Gas 2, when the voltage is applied to the first to fourth plasma electrodes 501, 502, 503, and 504, the reaction gas is supplied through the gas inlets 172, 182, 192, and 202 of the first to fourth reaction spaces 170, 180, 190, and 200 to generate the plasma to the first to fourth reaction spaces 170, 180, 190, and 200, and if the plasma generation period is finished, the voltage is blocked to the first to fourth plasma electrodes 501, 502, 503, and 504 and the reaction gas is not supplied to the gas inlets 172, 182, 192, and 202 of the first to fourth reaction spaces 170, 180, 190, and 200. This process is periodically repeated.

In this way, the plasma processor 600a of the multi-wafer deposition apparatus according to an exemplary embodiment of the present invention includes the plurality of distributors 641a and 641b connected to the reaction spaces such that the plasma voltage is controlled for applying to the predetermined reaction spaces during the predetermined time period.

Figure 5:
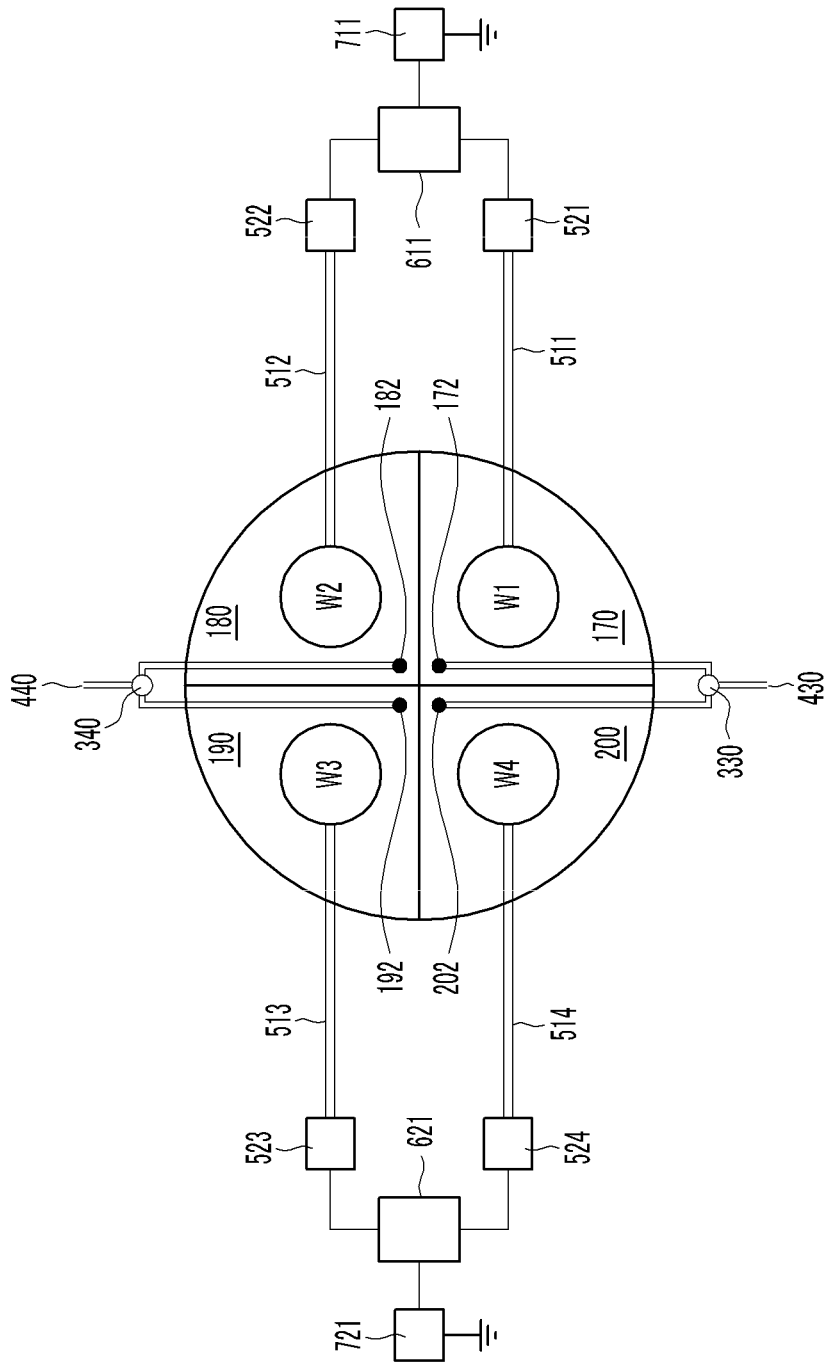
FIG. 5 is a layout view of a multi-wafer deposition apparatus according to the second exemplary embodiment of the present invention.
Figure 6:
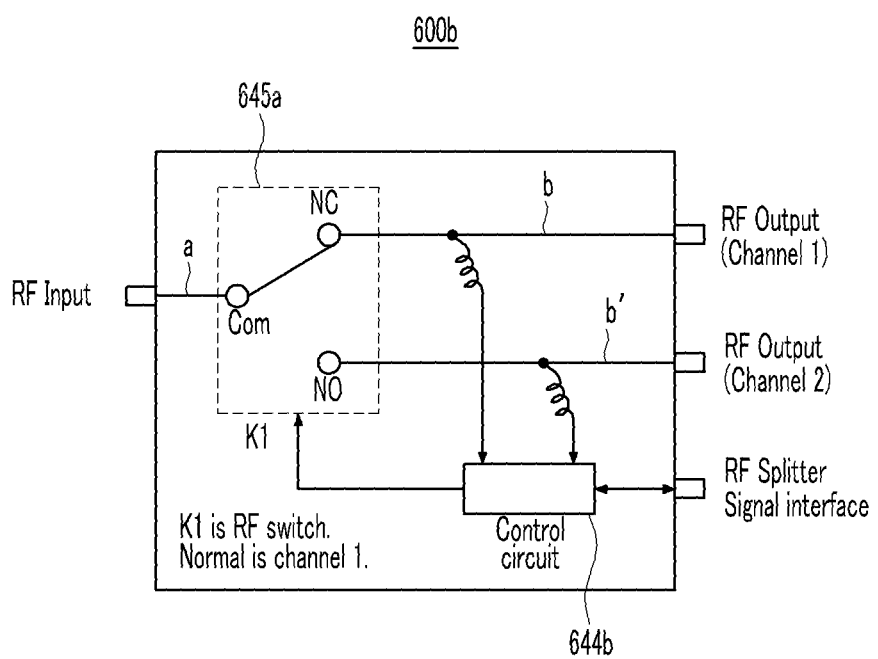
FIG. 6 is a schematic view of a plasma processor in a multi-wafer deposition apparatus according to the second exemplary embodiment of the present invention.
Figures 7A, 7B:
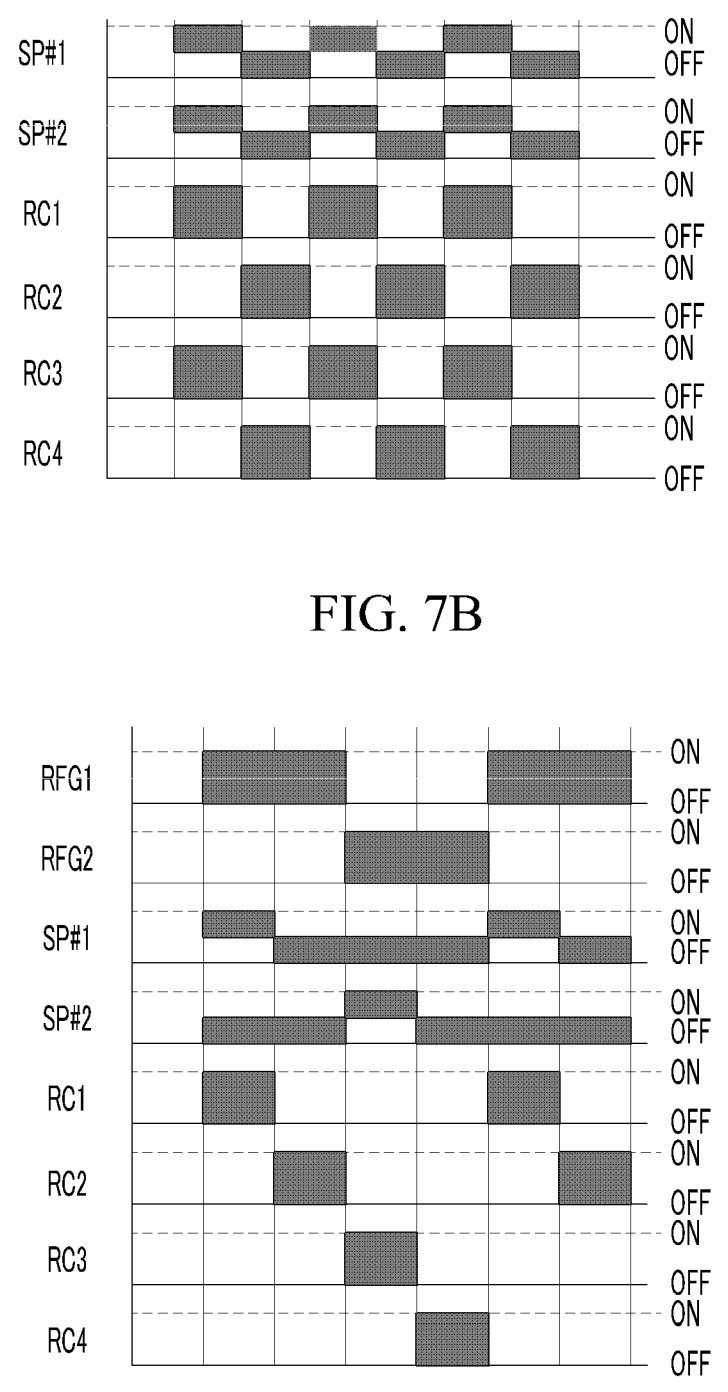

Next, a plasma processor and an operation thereof of a multi-wafer deposition apparatus according to the second exemplary embodiment of the present invention will be described with reference to FIG. 5, FIG. 6, and FIG. 7A and FIG. 7B. FIG. 5 is a layout view of a multi-wafer deposition apparatus according to another exemplary embodiment of the present invention, FIG. 6 is a schematic view of a plasma processor in a multi-wafer deposition apparatus according to another exemplary embodiment of the present invention, FIG. 7A and FIG. 7B are waveform diagrams illustrating an operation of a multi-wafer deposition apparatus.

Referring to FIG. 5, a multi-wafer deposition apparatus according to the present exemplary embodiment is similar to the multi-wafer deposition apparatus shown in FIG. 1 and FIG. 2. The multi-wafer deposition apparatus according to the present exemplary embodiment includes a plurality of reaction spaces 170, 180, 190, and 200, and first to fourth plasma electrodes 511, 512, 513, and 514 respectively inserted into the reaction spaces 170, 180, 190, and 200. The first to fourth plasma electrodes 511, 512, 513, and 514 are respectively connected with first to fourth matching members 521, 522, 523, and 524, and the first matching member 521 and the second matching member 522, and the third matching member 523 and the fourth matching member 524, are respectively connected in pairs to a first plasma processor 611 and a second plasma processor 621. Also, the first plasma processor 611 and the second plasma processor 621 are respectively connected to a first power source 711 and a second power source 721. Like the above-described exemplary embodiment, in the multi-wafer deposition apparatus according to an exemplary embodiment of the present invention, the first plasma processor 611 connected to the first power source 711 receives the power from the first power source 711, and applies the power with a predetermined magnitude during a predetermined time to the first matching member 521 and the second matching member 522 such that the first plasma electrode 511 and the second plasma electrode 512 are applied with the predetermined voltage. Also, the second plasma processor 621 connected to the second power source 721 receives the power from the second power source 721, and applies the power with a predetermined magnitude during the predetermined time to the third matching member 523 and the fourth matching member 524 such that the third plasma electrode 513 and the fourth plasma electrode 514 may be applied with the predetermined voltage.

Also, the first inlet 172 and the fourth inlet 202, and the second inlet 182 and the third inlet 192, of the multi-wafer deposition apparatus according to the present exemplary embodiment are respectively connected to one of outer pipes 430 and 440 at intersecting points, and the intersecting points may include switches 330 and 340. Through the switches 330 and 340, respectively, one of the first inlet 172 and the fourth inlet 202 may be connected to the outer pipe 430, and one of the third inlet 192 and the second inlet 182 may be connected to the outer pipe 440.

The plasma processors 611 and 621 of the multi-wafer deposition apparatus according to the present exemplary embodiment respectively include a plasma splitter 600b. Referring to FIG. 6, the plasma splitter 600b includes a switch 645a for switching one power application unit a and two power output units b and b', and a driving circuit 644b for controlling the operation of the splitter 600b. The driving circuit 644b is connected to each power output unit b and b' to measure the plasma power that is output to the power output units b and b' such that the driving circuit 644b measures the operation of the switch 645a and confirms the correct switching, and controls the operation of the splitter 600b depending on an external signal (a splitter signal interface) such that the input plasma power is outputted to the predetermined output units b and b' with the predetermined magnitude.

An example of the operation of the plasma splitter 600b shown in FIG. 6 is described. When the driving circuit 644b controls the switch 645a depending on the external signal, the switch is in the on state, and then, the power application unit a is connected to the output unit b such that the output unit b is applied with the plasma power. When the switch is in the off state, the power application unit a is connected to the output unit b', and then, the output unit b' is applied with the plasma power. In this way, the plasma processors 611 and 621 of the multi-wafer deposition apparatus according to the present exemplary embodiment includes the plasma splitter 600b such that the plasma power may be applied to the predetermined output units b and b' depending on the external signal.

An operation of the multi-wafer deposition apparatus including the plasma splitter 600b shown in FIG. 6 will be described with reference to FIG. 7A and FIG. 7B.

The plasma splitter 600b according to the present exemplary embodiment may be one example of the first plasma processor 611 or the second plasma processor 621 of the multi-wafer deposition apparatus shown in FIG. 5, such that the output units b and b' may be respectively connected to the portion of the matching members 521, 522, 523, and 524 connected to the first to fourth plasma electrodes 511, 512, 513, and 514 connected to the plurality of reaction spaces, 170, 180, 190 and 200.

For example, when the plasma splitter 600b is the first plasma processor 611, the output units b and b' may be respectively connected to the first plasma electrode 511 disposed in the first reaction space 170 and the second plasma electrode 512 disposed in the second reaction space 180, or when the plasma splitter 600b is the second plasma processor 621, the output units b and b' may be respectively connected to the third plasma electrode 513 disposed in the third reaction space 190 and the fourth plasma electrode 514 disposed in the fourth reaction space 200.

In FIG. 7A and FIG. 7B, when the plasma splitter 600b is the first plasma processor 611, the on/off operation of the switch 645a of the plasma splitter 600b is denoted by SP#1, when the plasma splitter 600b is the second plasma processor 621, it is denoted by SP#2. Also, the on/off operation of the voltages applied to the first to fourth plasma electrodes 511, 512, 513, and 514 are respectively denoted by RC1, RC2, RC3, and RC4. In FIG. 7B, the on/off operations of the plasma power source 711 connected to the first plasma processor 611 and the plasma power source 721 connected to the second plasma processor 621 are respectively represented by RFG1 and RFG2.

Referring to FIG. 7A, as shown by SP#1 and SP#2, when the switch 645a of the plasma splitter 600b of the first plasma processor 611 and the second plasma processor 621 is in the on state, the power application unit a is connected to one output unit b of the two power output units b and b' such that the voltage is applied to the first plasma electrode 511 and the third plasma electrode 513 through the first matching member

521 and the third matching member 523 connected to the output unit b. Also, when the switch 645a of the plasma splitter 600b is in the off state, the power application unit a is connected to the output unit b' of the two power output units b and b' such that the voltage is applied to the second plasma electrode 512 and the fourth plasma electrode 514 through the second matching member 522 and the fourth matching member 524 that are connected to the output unit b'.

Referring to FIG. 7B, if the plasma power source 711 connected to the first plasma processor 611 is in the on state, the switch 645a of the plasma splitter 600b of the first plasma processor 611 is in the on state, the plasma power source 721 connected to the second plasma processor 621 is in the off state, and the switch 645a of the plasma splitter 600b of the second plasma processor 621 is in the off state, the power application unit a of the plasma splitter 600b in the first plasma processor 611 is connected to one output unit b of two power output units b and b', and the voltage is applied to the first plasma electrode 511 through the first matching member 521 connected to the output unit b.

Also, if the plasma power source 711 connected to the first plasma processor 611 is in the on state, the switch 645a of the plasma splitter 600b of the first plasma processor 611 is in the off state, the plasma power source 721 connected to the second plasma processor 621 is in the off state, and the switch 645a of the plasma splitter 600b of the second plasma processor 621 is in the off state, the power application unit a of the plasma splitter 600b in the first plasma processor 611 is connected to the output unit b' of the two power output units b and b', and the voltage is applied to the second plasma electrode 512 through the second matching member 521 connected to the output unit b'.

Also, if the plasma power source 711 connected to the first plasma processor 611 is in the off state, the switch 645a of the plasma splitter 600b of the first plasma processor 611 is in the off state, the plasma power source 721 connected to the second plasma processor 621 is in the on state, and the switch 645a of the plasma splitter 600b of the second plasma processor 621 is in the on state, the power application unit a of the plasma splitter 600b in the second plasma processor 621 is connected to one output unit b of the power output units b and b', and the voltage is applied to the third plasma electrode 513 through the third matching member 523 connected to the output unit b.

Further, if the plasma power source 711 connected to the first plasma processor 611 is in the off state, the switch 645a of the plasma splitter 600b of the first plasma processor 611 is in the off state, the plasma power source 721 connected to the second plasma processor 621 is in the on state, and the switch 645a of the plasma splitter 600b of the second plasma processor 621 is in the off state, the power application unit a of the plasma splitter 600b in the second plasma processor 621 is connected to the output unit b' of the two power output units b and b', and the voltage is applied to the fourth plasma electrode 514 through the fourth matching member 524 connected to the output unit b'.

In this way, the plasma processors 611 and 621 of the multi-wafer deposition apparatus according to the present exemplary embodiment controls the on/off operation of the plasma power sources 711 and 721 connected to the plasma splitter 600b, and the on/off operation of the switch 645a of the plasma splitter 600b, such that the plasma voltage may be sequentially applied to the respective reaction spaces 170, 180, 190, and 200 during the predetermined time period.

A plasma processor and an operation thereof of a multi-wafer deposition apparatus according to the third exemplary embodiment of the present invention will be described with reference to FIG. 8, FIG. 9, and FIG. 10. FIG. 8 is a layout view of a multi-wafer deposition apparatus according to third exemplary embodiment of the present invention, FIG. 9 is a schematic view of a plasma processor in a multi-wafer deposition apparatus according to third exemplary embodiment of the present invention, and FIG. 10 is a waveform diagram illustrating an operation of a multi-wafer deposition apparatus according to third exemplary embodiment of the present invention.

Referring to FIG. 8, the multi-wafer deposition apparatus according to the present exemplary embodiment includes a plurality of reaction spaces 170, 180, 190, and 200, and first to fourth plasma electrodes 531, 532, 533, and 534 respectively inserted into the reaction spaces 170, 180, 190, and 200. The first to fourth plasma electrodes 531, 532, 533, and 534 are respectively connected with first to fourth matching members 541, 542, 543, and 544, and the first to fourth matching members 541, 542, 543, and 544 are all connected to a plasma processor 650. Also, the plasma processor 650 is connected to a plasma power source 750. In the multi-wafer deposition apparatus according to the present exemplary embodiment, the plasma processor 650 connected to the plasma power source 750 receives power from the plasma power source 750, and applies it to the first to fourth matching members 541, 542, 543, and 544 with the predetermined magnitude during the predetermined time such that the predetermined voltage is applied to the first to fourth plasma electrodes 531, 532, 533, and 534.

Also, the first inlet 172 and the second inlet 182, and the third inlet 192 and the fourth inlet 202, of the multi-wafer deposition apparatus according to the present exemplary embodiment are respectively connected to one of external pipes 450 and 460 at intersecting points, and the intersecting points may include switches 350 and 360. Through the switches 350 and 360, one of the first inlet 172 and the second inlet 182 may be connected to the external pipe 450, and one of the third inlet 192 and the fourth inlet 202 may be connected to the external pipe 460.

Figure 9:
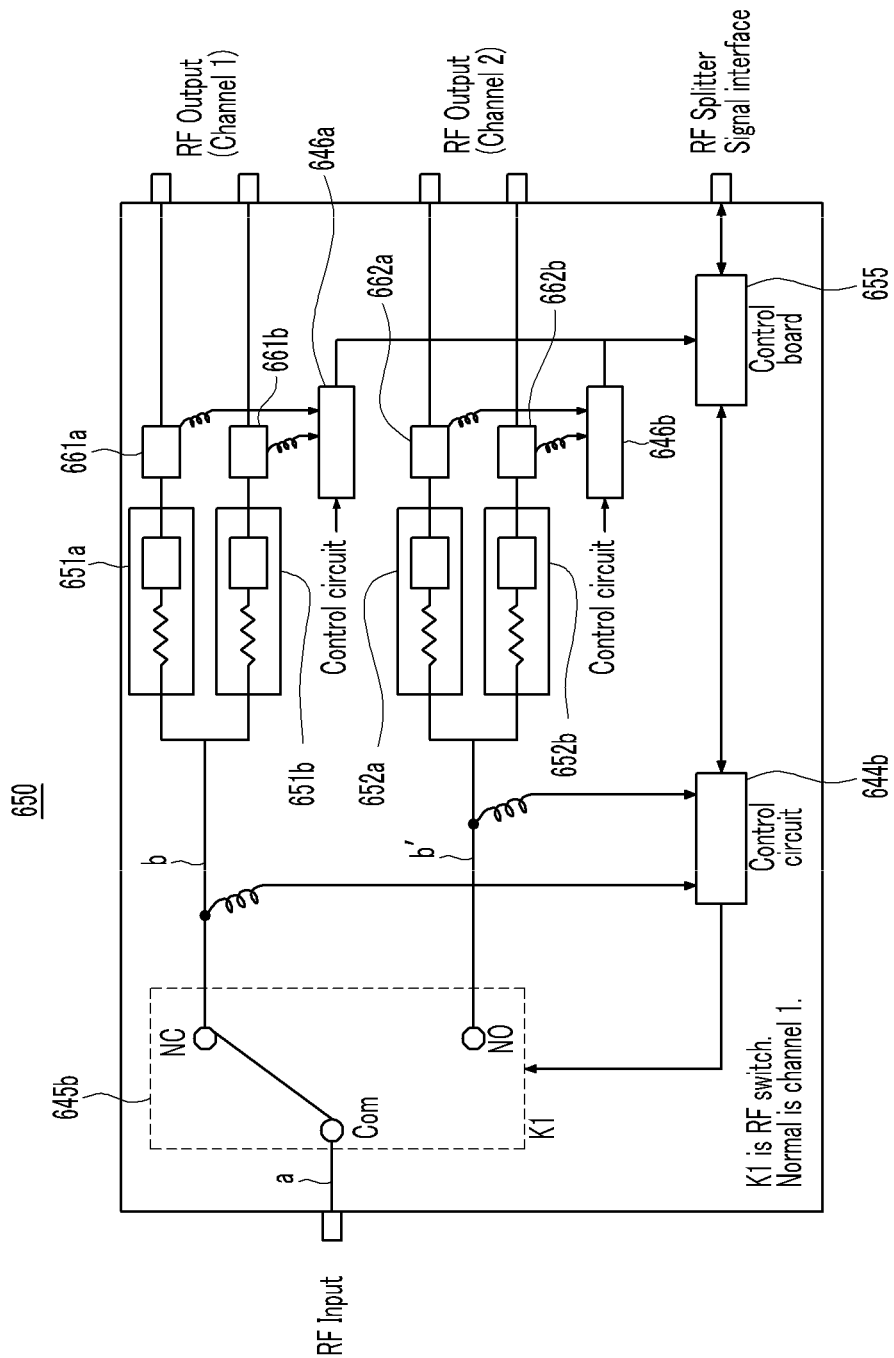
FIG. 9 is a schematic view of a plasma processor in a multi-wafer deposition apparatus according to third exemplary embodiment of the present invention.

Referring to FIG. 9, the plasma processor 650 of the multi-wafer deposition apparatus according to the present exemplary embodiment includes a splitter including a switch 645b that switches by connecting one power application unit a and two power output units b and b' to each other, and a plasma splitter including a splitter driving circuit 644b controlling the splitter. Further, the plasma processor 650 of the multi-wafer deposition apparatus according to the present exemplary embodiment includes a plasma distributing unit including first and second distributors 651a and 651b and a first distributor driving circuit 646a that are connected to the power output unit b, and third and fourth distributors 652a and 652b and a second distributor driving circuit 646b that are connected to the power output unit b'.

The plasma processor 650 of the multi-wafer deposition apparatus according to the present exemplary embodiment includes first and second sensors 661a and 661b that are connected to the first and second distributors 651a and 651b and third and fourth sensors 662a and 662b that are connected to the third and fourth distributors 652a and 652b, and a control board 655 driving the splitter driving circuit 644b, the first distributor driving circuit 646a, and the second distributor driving circuit 646b.

The splitter driving circuit 644b of the plasma processor 650 of the multi-wafer deposition apparatus according to the present exemplary embodiment is connected to power output units b and b' thereby measuring the plasma power output of the power output units b and b', such that correct switching is confirmed by measuring the operation of the switch 645b, and it is operated for the input plasma power to be output to the respective output units b and b' with a predetermined magnitude by controlling the operation of the switch 645b depending on an external signal.

Also, the first distributor driving circuit 646a and the second distributor driving circuit 646b measure the magnitude of the power output from the distributors 651a, 651b, 652a, and 652b by using the first and second sensors 661a and 661b connected to the first and second distributors 651a and 651b, and the third and fourth sensors 662a and 662b connected to the third and fourth distributors 652a and 652b, to determine whether the input plasma power is distributed with the predetermined magnitude, and control the magnitude of the power output from the distributors 651a, 651b, 652a, and 652b, and the distributors 651a, 651b, 652a, and 652b depending on the external signal to distribute the input plasma power with the predetermined magnitude.

The distributors 651a, 651b, 652a, and 652b are respectively connected to the first to fourth matching members 541, 542, 543, and 544 respectively connected to the first to fourth plasma electrodes 531, 532, 533, and 534 shown in FIG. 8. Accordingly, the power applied from the plasma power source 750 according to the operation of the plasma splitter and the plasma distributing unit of the plasma processor 650 is applied to the first to fourth matching members 541, 542, 543, and 544 with the predetermined magnitude during the predetermined time, such that the desired voltage is applied to the first to fourth plasma electrodes 531, 532, 533, and 534.

The operation of the plasma processor 650 of the multi-wafer deposition apparatus according to the present exemplary embodiment will be described with reference to FIG. 9 and FIG. 10. In FIG. 10, the on/off operation of the plasma splitter is represented as SP, and the on/off operation of the voltage applied to the first to fourth plasma electrodes 531, 532, 533, and 534 are respectively represented as RC1, RC2, RC3, and RC4.

Referring to FIG. 10, if the switch 645b of the plasma splitter is in the on state, the power application unit a connected to the plasma power source 750 is connected to the output unit b of the two power output units b and b', and the power output to the output unit b is distributed by the first and second distributors 651a and 651b connected to the power output unit b such that the first and second plasma electrodes 531 and 532 are applied with the plasma voltage. Also, if the switch 645b of the plasma splitter is in the off state, the power application unit a connected to the plasma power source 750 is connected to the output unit b' of the two power output units b and b', and the power output to the output unit b' is distributed by the third and fourth distributors 652a and 652b connected to the power output unit b' such that the third and fourth plasma electrodes 533 and 534 are applied with the plasma voltage.

In this way, the plasma processor 650 of the multi-wafer deposition apparatus according to the present exemplary embodiment includes the plasma splitter and the plasma distributing unit such that the plasma voltage may be applied to the predetermined reaction space during the predetermined time period by controlling the above-described operation.

Figure 11:
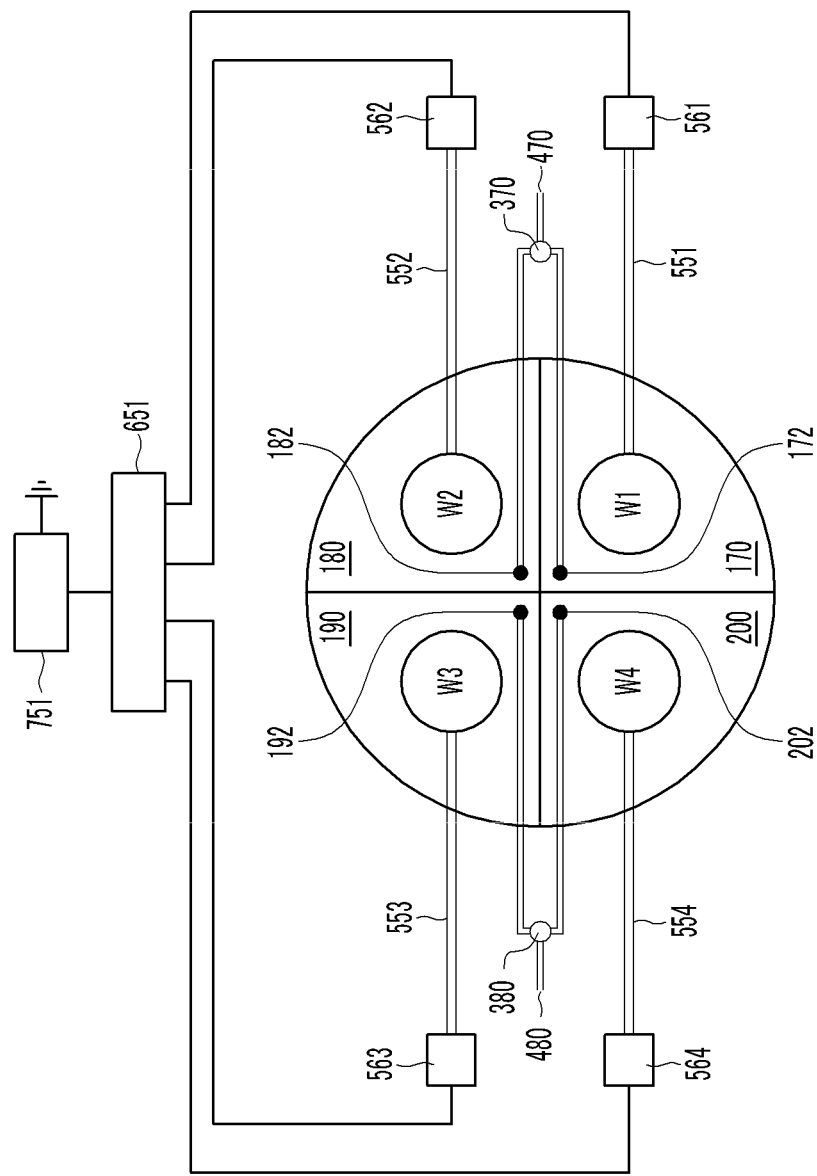
FIG. 11 is a layout view of a multi-wafer deposition apparatus according to forth exemplary embodiment of the present invention.

A plasma processor and an operation thereof of a multi-wafer deposition apparatus according to the fourth exemplary embodiment of the present invention will be described with reference to FIG. 11 to FIG. 13. FIG. 11 is a layout view of a multi-wafer deposition apparatus according to forth exemplary embodiment of the present invention, FIG. 12 is a schematic view of a plasma processor in a multi-wafer deposition apparatus according to forth exemplary embodiment of the present invention, and FIG. 13 is a waveform diagram illustrating an operation of a multi-wafer deposition apparatus according to forth exemplary embodiment of the present invention.

Referring to FIG. 11, the multi-wafer deposition apparatus according to the present exemplary embodiment includes a plurality of reaction spaces 170, 180, 190, and 200, and first to fourth plasma electrodes 551, 552, 553, and 554 respectively inserted into the reaction spaces 170, 180, 190, and 200. The first to fourth plasma electrodes 551, 552, 553, and 554 are respectively connected with first to fourth matching members 561, 562, 563, and 564, and the first to fourth matching members 561, 562, 563, and 564 are all connected to a plasma processor 651. Also, the plasma processor 651 is connected to a plasma power source 751. In the multi-wafer deposition apparatus according to the present exemplary embodiment, the plasma processor 651 connected to the plasma power source 751 receives power from the plasma power source 751, and applies it to the first to fourth matching members 561, 562, 563, and 564 with a predetermined magnitude during a predetermined time such that a predetermined voltage is applied to the first to fourth plasma electrodes 551, 552, 553, and 554.

Also, the first inlet 172 and the second inlet 182, and the third inlet 192 and the fourth inlet 202, of the multi-wafer deposition apparatus according to the present exemplary embodiment are respectively connected to one of external pipes 470 and 480 at intersecting points, and the intersecting points may include switches 370 and 380. Through the switches 370 and 380, one of the first inlet 172 and the second inlet 182 may be connected to the external pipe 470, and one of the third inlet 192 and the fourth inlet 202 may be connected to the external pipe 480.

Figure 12:
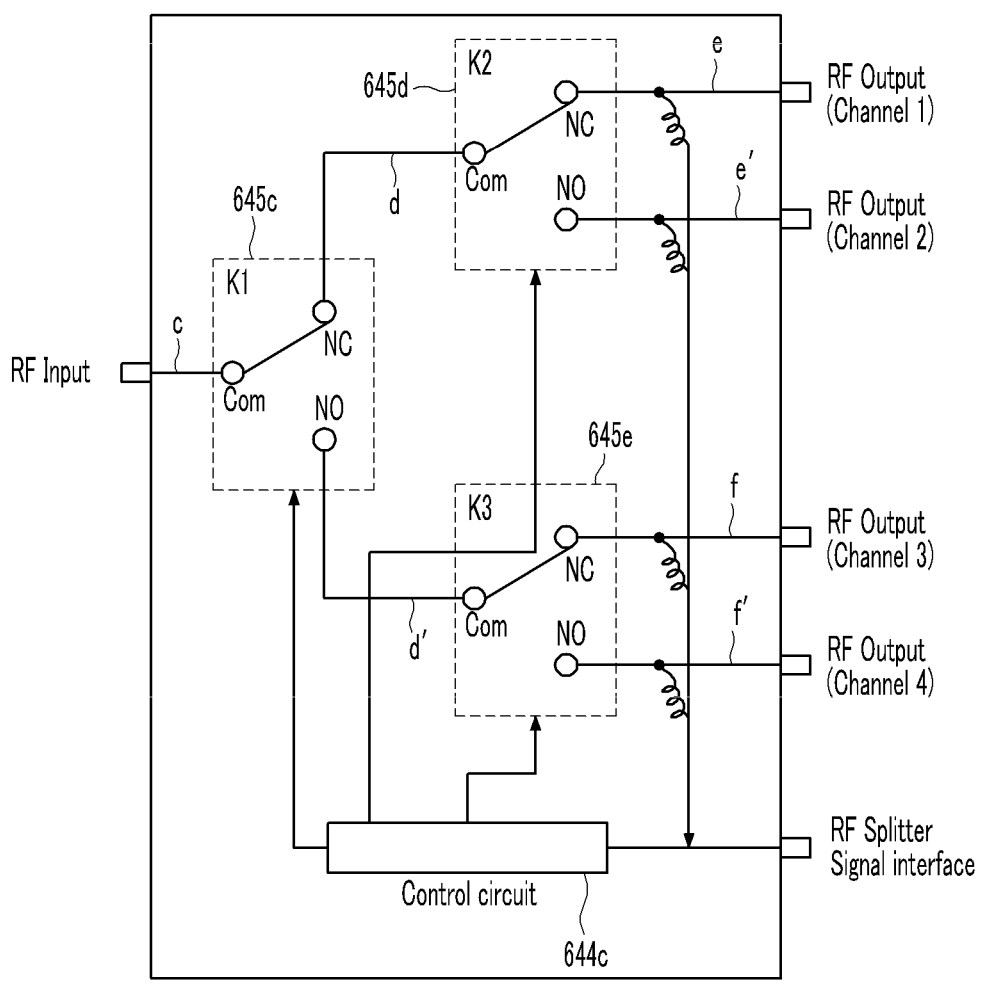
FIG. 12 is a schematic view of a plasma processor in a multi-wafer deposition apparatus according to forth exemplary embodiment of the present invention.

Referring to FIG. 12, the plasma processor 651 of the multi-wafer deposition apparatus according to the present exemplary embodiment includes a first switch 645c that switches by connecting one power application unit c and two power output units d and d' to each other, a second switch 645d that switches by connecting the first power output unit d and two third output units e and e' to each other, a third switch 645e that switches by connecting the second power output unit d' and two fourth output units f and f', and a splitter driving circuit 644c connected to the third output units e and e' and the fourth output units f and f' and controlling the first to third switches 645c, 645d, and 645e depending on the magnitude of the output voltage and an external signal. The splitter driving circuit 644c of the plasma processor 651 of the multi-wafer deposition apparatus according to the present exemplary embodiment is connected to the third output units e and e' and the fourth output units f and f' thereby measuring the operation of the first to third switches 645c, 645d, and 645e by measuring the plasma power output to the third output units e and e' and the fourth output units f and f' such that correct switching is confirmed, and the splitter driving circuit 644c controls the operation of the first to third switches 645c, 645d, and 645e depending on the external signal such that the input plasma power is output to the third output units e and e' and the fourth output units f and f'.

The third output units e and e' and the fourth output units f and f' are respectively connected to the first to fourth matching members 561, 562, 563, and 564 connected to the first to fourth plasma electrodes 551, 552, 553, and 554 shown in FIG. 11. Accordingly, the power applied from the plasma power source 751 is applied to the first to fourth matching members 561, 562, 563, and 564 with the predetermined magnitude during the predetermined time according to the operation of the first to third switches 645c, 645d, and 645e of the plasma splitter of the plasma processor 651 such that the predetermined voltage is applied to the first to fourth plasma electrodes 551, 552, 553, and 554.

The operation of the plasma processor 651 of the multi-wafer deposition apparatus according to the present exemplary embodiment will be described with reference to FIG. 12 and FIG. 13. In FIG. 13, the on/off operation of the first to third switches 645*c*, 645*d*, and 645*e* of the plasma splitter are respectively represented as SP1, SP2 and SP3, and the on/off operation of the voltage applied to the first to fourth plasma electrodes 551, 552, 553, and 554 are respectively represented as RC1, RC2, RC3, and RC4.

Referring to FIG. 12 and FIG. 13, if the first switch 645*c* and the second switch 645*d* of the plasma splitter are in the on state and the third switch 645*e* is in the off state, the power application unit c is connected to the power output unit e of the second power output units e and e' through the first power output unit d such that the plasma voltage is applied to the first plasma electrode 551.

Also, if the first switch 645*c* of the plasma splitter is in the on state and the second switch 645*d* and the third switch 645*e* are in the off state, the power application unit c is connected to the power output unit e' of the second power output units e and e' through the first power output unit d such that the plasma voltage is applied to the second plasma electrode 552.

Further, if the first switch 645*c* and the second switch 645*d* of the plasma splitter are in the off state and the third switch 645*e* is in the on state, the power application unit c is connected to the power output unit f of the second power output units f and f' through the second power output unit d' such that the plasma voltage is applied to the third plasma electrode 553.

Also, if the first switch 645*c* to the third switch 645*e* of the plasma splitter are in the off state, the power application unit c is connected to the power output unit f' of the second power output units f and f' through the second power output unit d' such that the plasma voltage is applied to the fourth plasma electrode 554.

In this way, the plasma processor 651 of the multi-wafer deposition apparatus according to the present exemplary embodiment controls the on/off operation of the first to the third switches 645*c*, 645*d*, and 645*e* of the plasma splitter such that the plasma voltage may be sequentially applied to the predetermined reaction spaces 170, 180, 190, and 200 during the predetermined time period.

Figure 14:
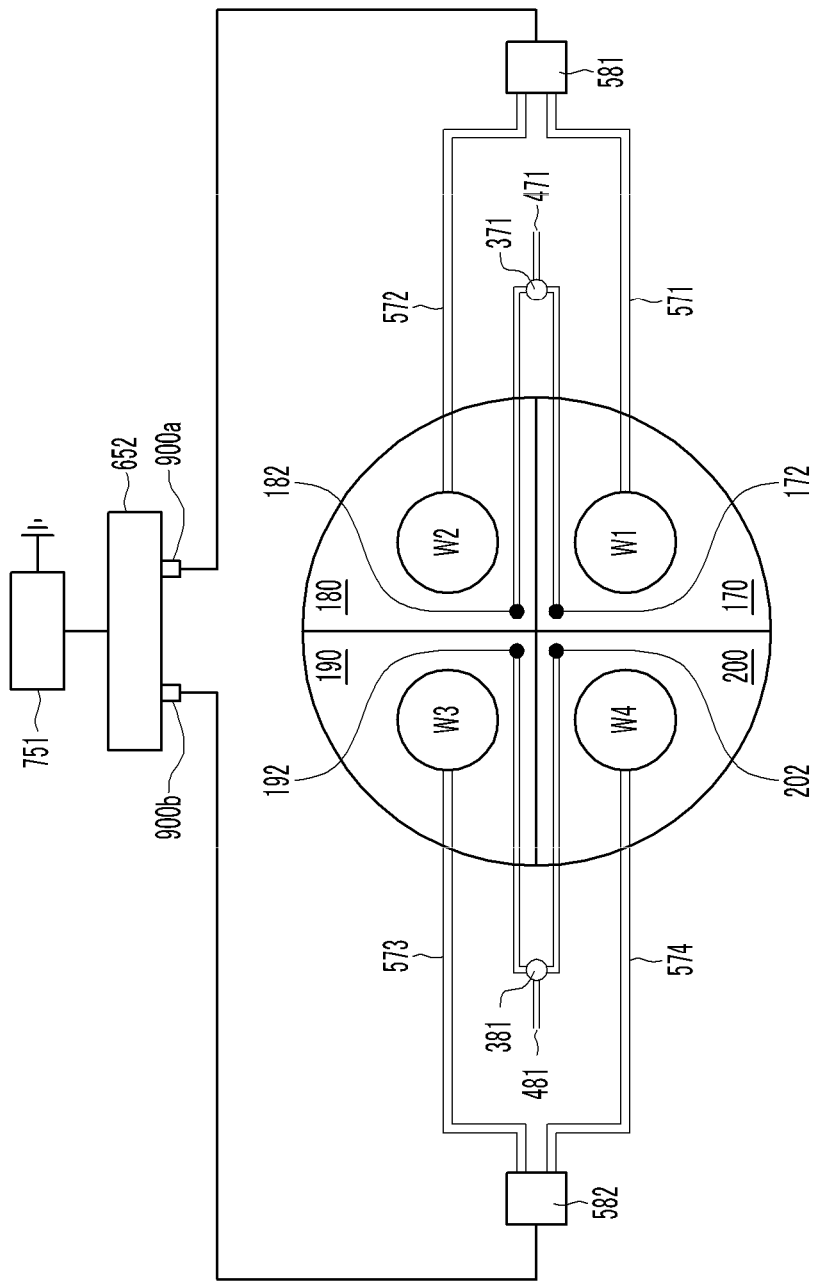
FIG. 14 is a layout view of a multi-wafer deposition apparatus according to fifth exemplary embodiment of the present invention.
Figures 15, 16:
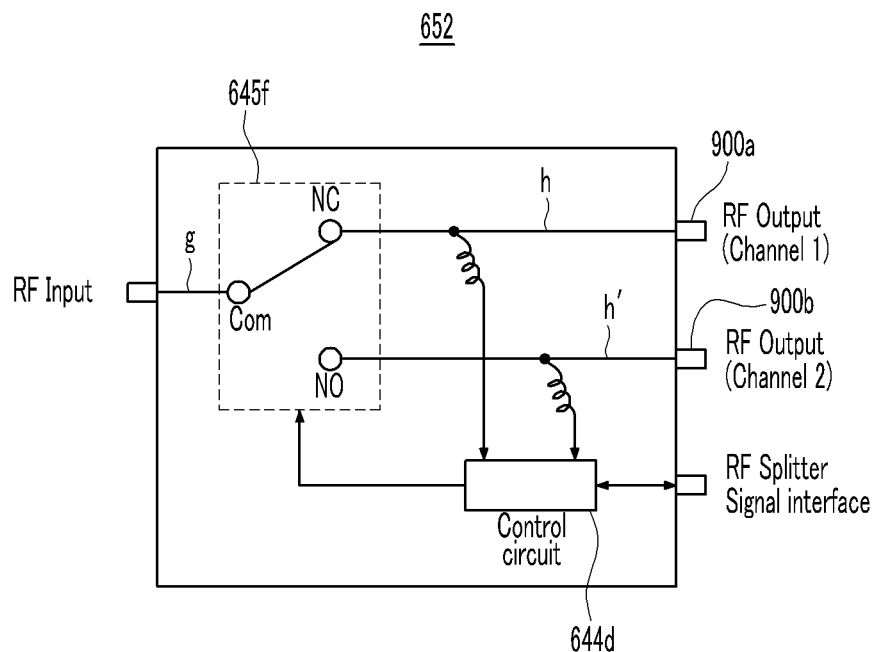
FIG. 15 is a schematic view of a plasma processor in a multi-wafer deposition apparatus according to fifth exemplary embodiment of the present invention.
FIG. 16 is a waveform diagram illustrating an operation of a multi-wafer deposition apparatus according to fifth exemplary embodiment of the present invention.

A plasma processor and an operation thereof of a multi-wafer deposition apparatus according to the fifth exemplary embodiment of the present invention will be described with reference to FIG. 14 to FIG. 16. FIG. 14 is a layout view of a multi-wafer deposition apparatus according to fifth exemplary embodiment of the present invention, FIG. 15 is a schematic view of a plasma processor in a multi-wafer deposition apparatus according to fifth exemplary embodiment of the present invention, and FIG. 16 is a waveform diagram illustrating an operation of a multi-wafer deposition apparatus according to fifth exemplary embodiment of the present invention.

Referring to FIG. 14, the multi-wafer deposition apparatus according to the present exemplary embodiment includes a plurality of reaction spaces 170, 180, 190, and 200, and first to fourth plasma electrodes 571, 572, 573, and 574 respectively inserted into the reaction spaces 170, 180, 190, and 200. The first and second plasma electrodes 571 and 572 are commonly connected to a first matching member 581, and the third and fourth plasma electrodes 573 and 574 are commonly connected to a second matching member 582.

The first and second matching members 581 and 582 are connected to a plasma processor 652 through first and second connections 900*a* and 900*b*. Also, the plasma processor 652 is connected to the plasma power source 751. In the multi-wafer deposition apparatus according to the present exemplary embodiment, the plasma processor 652 connected to the plasma power source 751 receives the power from the plasma power source 751, and applies it to the first and second matching members 581 and 582 through the first and second connections 900*a* and 900*b* with a predetermined magnitude during a predetermined time such that a predetermined voltage is applied to the first to fourth plasma electrodes 571, 572, 573, and 574.

Also, the first inlet 172 and the second inlet 182, and the third inlet 192 and the fourth inlet 202, of the multi-wafer deposition apparatus according to the present exemplary embodiment are respectively connected to one of external pipes 471 and 481 at intersecting points, and the intersecting points may include switches 371 and 381. Through the switches 371 and 381, one of the first inlet 172 and the second inlet 182 may be connected to the external pipes 471, and one of the third inlet 192 and the fourth inlet 202 may be connected to the external pipe 481.

Referring to FIG. 15, the plasma processor 652 includes a plasma splitter. In detail, the plasma processor 652 includes a driving circuit 644*d* controlling a switch 645*f*, and the switch 645*f* connects and switches the power application unit g and two power output units h and h' connected to the plasma power source 751. The driving circuit 644*d* that is connected to the power output units h and h' measures the operation of the switch 645*f* by measuring the plasma power output to the power output units h and h' and thereby the correct switching is confirmed, and the driving circuit 644*d* controls the operation of the plasma processor 652 depending on an external signal (a splitter signal interface) such that the input plasma power is outputted to the respective output units h and h'.

If the driving circuit 644*d* controls the switch 645*f* depending on the external signal such that the switch is in the on state, the power application unit g is connected to the output unit h of the power output units h and h' such that the output unit h is applied with the plasma power, and this power is transmitted to the first connection 900*a* connected to the output unit h. Also, if the driving circuit 644*d* controls the switch 645*f* depending on the external signal such that the switch is in the off state, the power application unit g is connected to the output unit h' of the power output units h and h' such that the output unit h' is applied with the plasma power, and this power is transmitted to the second connection 900*b* connected to the output unit h'. In this way, the plasma processor 652 of the multi-wafer deposition apparatus according to the present exemplary embodiment includes the plasma splitter such that the plasma power may be applied to the desired output units h and h' depending on the external signal.

The operation of the plasma processor 651 of the multi-wafer deposition apparatus according to the exemplary embodiment will be described with reference to FIG. 16. In FIG. 16, the on/off operation of the plasma splitter is represented as SP, and the on/off operation of the voltage applied to the first to fourth plasma electrodes 571, 572, 573, and 574 are represented as RC1, RC2, RC3, RC4.

Referring to FIG. 16, if the switch 645*f* of the plasma processor 651 is in the on state, the power application unit g connected to the plasma power source 751 is connected to the output unit h of the power output units h and h', and the power output to the output unit h is transmitted to the first matching member 581 through the first connection 900*a* such that the plasma voltage is applied to the first and second plasma electrodes 571 and 572. Also, if the switch 645*f* of the plasma splitter is in the off state, the power application unit g connected to the plasma power source 751 is connected to the output unit h' of the power output units h and h' and the power output to the output unit h' is transmitted to the second matching member 582 through the second connection 900b such that the plasma voltage is applied to the third and fourth plasma electrodes 573 and 574.

In this way, the plasma processor 651 of the multi-wafer deposition apparatus according to the present exemplary embodiment includes the plasma splitter such that the plasma voltage may be applied to the plurality of reaction spaces during the predetermined time period through the control of this operation.

Figure 17:
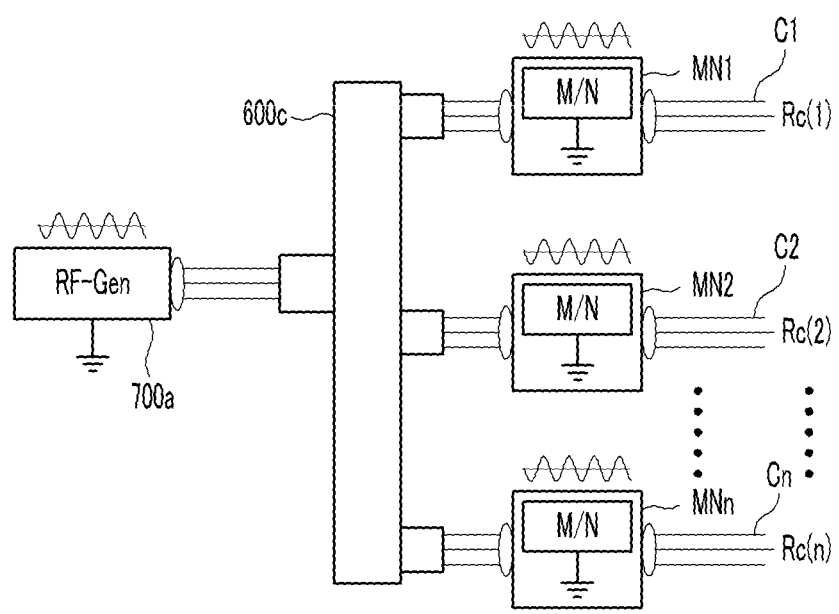
FIG. 17 is a schematic view of a multi-wafer deposition apparatus according to another exemplary embodiment of the present invention.

A multi-wafer deposition apparatus according to another exemplary embodiment of the present invention will be described with reference to FIG. 17. FIG. 17 is a schematic view of a multi-wafer deposition apparatus according to another exemplary embodiment of the present invention.

Referring to FIG. 17, a multi-wafer deposition apparatus according to the present exemplary embodiment includes a plurality of plasma electrodes C1 to Cn and matching members MN1 to MNn respectively connected to the plasma electrodes C1 to Cn, wherein all matching members MN1 to MNn are connected to one plasma splitter 600c and the plasma splitter 600c is connected to a plasma power source 700a. Although not shown, the plasma splitter 600c may include a plurality of switches and driving circuits, and by controlling the on/off operation of the switches, the predetermined plasma electrodes of the plasma electrodes C1 to Cn may be connected to the input portion of the plasma power source 700a such that the predetermined plasma electrodes C1 to Cn may be applied with a plasma voltage to generate the plasma in a respective reaction space.

Figure 18:
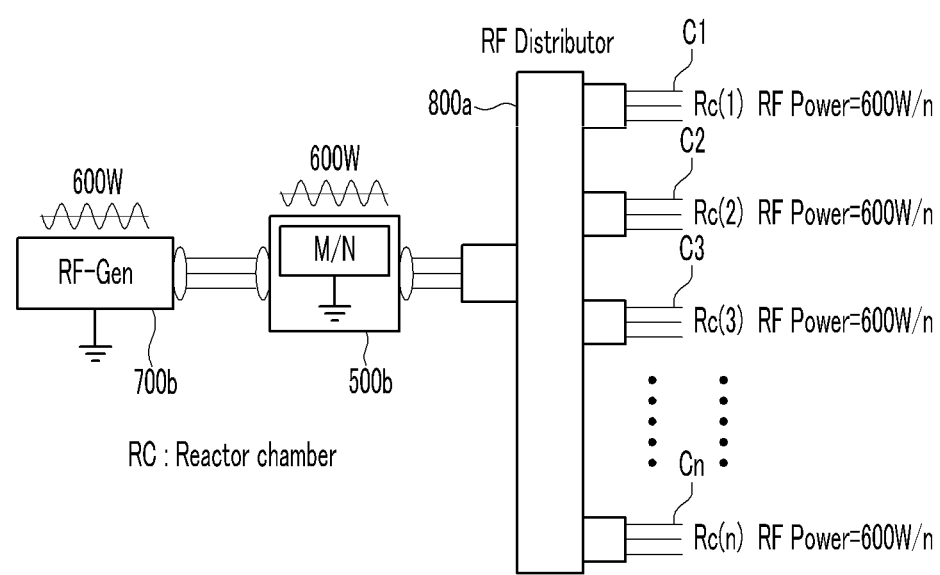
FIG. 18 is a schematic view of a multi-wafer deposition apparatus according to another exemplary embodiment of the present invention.

A multi-wafer deposition apparatus according to another exemplary embodiment of the present invention will be described with reference to FIG. 18. FIG. 18 is a schematic view of a multi-wafer deposition apparatus according to another exemplary embodiment of the present invention.

Referring to FIG. 18, a multi-wafer deposition apparatus according to the present exemplary embodiment includes a plurality of plasma electrodes C1 to Cn, and a plasma distributing unit 800a respectively connected to each of the plasma electrodes C1 to Cn. The plasma distributing unit 800a is connected to matching member 500b, and the matching member 500b is connected to plasma power source 700b.

Although not shown, the plasma distributing unit 800a includes a plurality of distributors such that the plasma power input from the input portion of the plasma power source 700b is equally distributed to the plasma electrodes C1 to Cn, and accordingly the uniform plasma voltage is applied to the plasma electrodes C1 to Cn such that uniform plasma may be generated to the plurality of reaction spaces.

The deposition apparatus and plasma processor according to the above-described exemplary embodiment of the present invention may be variously changed and have improved shapes based on the idea of the present invention. For example, four reaction spaces 170, 180, 190, and 200 are shown in FIG. 1, FIG. 2, FIG. 5, FIG. 8, FIG. 11, and FIG. 14, however the deposition apparatus according to an exemplary embodiment of the present invention may include another number of reaction spaces, and the number plasma splitters and plasma distributors may be determined by considering the number of reaction spaces and the plasma power source used. In addition, the type and structure of multi-wafer deposition system may be varied or modified from those of this invention within the equivalent and same concept.

Also, the deposition apparatus according to the above-described exemplary embodiment of the present invention may include a control system or a controller (not shown). The control system (controller) controls a controlling circuit controlling the operation of the plasma splitter and the plasma distributor as well as various wafer process steps such as the kind and period of gas input to the reaction space, the pressure inside the reaction space, the pump, the substrate temperature, and in-situ and/or remote plasma generation. The control system (controller) may include at least one of computers that are capable of communicating with each other, and various processing units processing the deposition apparatus to realize the deposition method according to an exemplary embodiment of the present invention.

In a portion of the above described exemplary embodiments, the optional constituent elements may be substituted for those that can realize the appropriate function.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A deposition apparatus comprising:
a plurality of reaction spaces including at least four reaction spaces;
a plurality of plasma electrodes including at least four plasma electrodes, each of the plurality of plasma electrodes disposed in a corresponding one of the plurality of reaction spaces;
a first gas pipe, a second gas pipe, a third gas pipe, and a fourth gas pipe, each of the gas pipes connected to a corresponding one of the plurality of reaction spaces, wherein the first gas pipe and the second gas pipe are connected to a first outer pipe at a first intersecting point and the third gas pipe and the fourth gas pipe are connected to a second outer pipe at a second intersecting point; and
a plasma processor comprising:
a plasma splitter, the plasma splitter comprising a switch;
a first plasma distributor connected to the plasma splitter;
a first output terminal connected to the first plasma distributor and at least one of the plurality of plasma electrodes;
a second plasma distributor connected to the plasma splitter;
a second output terminal connected to the second plasma distributor and at least one of the plurality of plasma electrodes;
a third plasma distributor connected to the plasma splitter;
a third output terminal connected to the third plasma distributor and at least one of the plurality of plasma electrodes;
a fourth plasma distributor connected to the plasma splitter;
a fourth output terminal connected to the fourth plasma distributor and at least one of the plurality of plasma electrodes;
a first plasma distributor driving circuit configured to measure a first magnitude of plasma power output from the first plasma distributor and the second plasma distributor, determine whether the first magnitude of plasma power output matches a first predetermined plasma power magnitude, and control the first magnitude of plasma power output;

a second plasma distributor driving circuit configured to measure a second magnitude of plasma power output from the third plasma distributor and the fourth plasma distributor, determine whether the second magnitude of plasma power output matches a second predetermined plasma power magnitude, and control the second magnitude of plasma power output;

a control board, the control board being configured to receive the first magnitude of plasma power output from the first plasma distributor driving circuit and the second magnitude of plasma power output from the second plasma distributor driving circuit;

a splitter driving circuit, separate from the control board and configured to receive a signal from the control board, the splitter driving circuit also being configured to control the switch of the plasma splitter depending on the first magnitude of plasma power output and the second magnitude of plasma power output, the splitter driving circuit also being configured to confirm a correct switching operation by measuring an operation of the switch;

wherein a position of the switch determines whether the first output terminal and the second output terminal apply a desired voltage to the at least one of the plurality of plasma electrodes or whether the third output terminal and the fourth output terminal apply a desired voltage to the at least one of the plurality of plasma electrodes.

2. The deposition apparatus of claim 1, wherein:
the plasma processor further comprise a first sensor disposed between the first output terminal and the first plasma distributor, a second sensor disposed between the second output terminal and the second plasma distributor, a third sensor disposed between the third output terminal and the third plasma distributor, and a fourth sensor disposed between the fourth output terminal and the fourth plasma distributor.

3. The deposition apparatus of claim 2, wherein the first plasma distributor driving circuit is connected to the first sensor and the second sensor for sensing power output of the first plasma distributor and the second plasma distributor and the second plasma distributor driving circuit is connected to the third sensor and the fourth sensor for sensing power output of the third plasma distributor and the fourth plasma distributor.

4. The deposition apparatus of claim 1, further comprising:
a plurality of matching members disposed between the plasma processor and the plasma electrodes.

5. The deposition apparatus of claim 1, wherein the first intersecting point comprises a first switch and the second intersecting point comprises a second switch.

6. The deposition apparatus of claim 4, wherein the plasma power source applies RF plasma power to the plurality of matching members.

* * * * *